`US010879608B2`

(12) United States Patent
Salazar-Cerreno et al.

(10) Patent No.: US 10,879,608 B2
(45) Date of Patent: Dec. 29, 2020

(54) RADIO FREQUENCY SCANNER

(71) Applicant: The Board of Regents of the University of Oklahoma, Norman, OK (US)

(72) Inventors: Jorge L. Salazar-Cerreno, Norman, OK (US); Damon Andrew Schmidt, Largo, FL (US); Caleb Fulton, Norman, OK (US); Robert D. Palmer, Norman, OK (US); Rodrigo Manuel Lebron Garcia, Norman, OK (US); Alessio Mancini, Norman, OK (US); Simon Thierry Pierre Duthoit, Norman, OK (US); Matthew Stephen McCord, Norman, OK (US); John Brent Meier, Norman, OK (US); Redmond Clay Kelley, Norman, OK (US)

(73) Assignee: The Board of Regents of the University of Oklahoma, Norman, OK (US)

( * ) Notice: Subject to any disclaimer, the term of this patent is extended or adjusted under 35 U.S.C. 154(b) by 186 days.

(21) Appl. No.: 15/703,660

(22) Filed: Sep. 13, 2017

(65) Prior Publication Data

US 2018/0090837 A1      Mar. 29, 2018

Related U.S. Application Data

(60) Provisional application No. 62/393,947, filed on Sep. 13, 2016.

(51) Int. Cl.
*H01Q 3/26*       (2006.01)
*H01Q 17/00*      (2006.01)
(Continued)

(52) U.S. Cl.
CPC ......... *H01Q 3/267* (2013.01); *G01R 29/0821* (2013.01); *G01R 29/105* (2013.01);
(Continued)

(58) Field of Classification Search
CPC ........................... H01Q 3/267; G01R 29/0821
(Continued)

(56) References Cited

U.S. PATENT DOCUMENTS

| 4,368,472 | A | * | 1/1983 | Gandhi | .................... H01Q 1/24 343/718 |
| 2011/0274183 | A1 | * | 11/2011 | Wang | .................... H04B 7/061 375/259 |
| 2018/0175476 | A1 | * | 6/2018 | Teshiba | .................... H01L 23/66 |

OTHER PUBLICATIONS

David Novotny "Antenna Measuremennt Implementations and Dynamic Positional Validation using a six axis robot," AMTA 37th Annual Meeting and Symposium (Year: 2015).*
(Continued)

*Primary Examiner* — Bo Fan
(74) *Attorney, Agent, or Firm* — Dunlap Codding, P.C.

(57) ABSTRACT

A radio frequency (RF) scanner system provided with a multi-axis articulated robot and a sensor suite positioned on a first end of the multi-axis articulated robot. The sensor suite is provided with a shield, an antenna array probe, and a surface sensor. The shield has a first side and a second side opposite the first side. The first side is configured for positioning towards an active phased array antenna. The surface sensor is configured to determine X, Y, and Z positions of the active phased array antenna.

20 Claims, 6 Drawing Sheets

(51) Int. Cl.
   G01R 29/10    (2006.01)
   G01R 29/08    (2006.01)
   H01Q 25/00    (2006.01)
   H01Q 3/08     (2006.01)
   H01Q 21/06    (2006.01)
(52) U.S. Cl.
   CPC ............ *H01Q 17/008* (2013.01); *H01Q 3/08* (2013.01); *H01Q 21/061* (2013.01); *H01Q 25/001* (2013.01)
(58) Field of Classification Search
   USPC ..................................... 342/1; 343/718, 895
   See application file for complete search history.

(56) References Cited

OTHER PUBLICATIONS

D.S. Zrnic et al., "Agile-Beam Phased Array Radar for Weather Observations," Bulletin of the American Meteorological Society, vol. 88, No. 11, pp. 1753-1766, 2007.
Wang et al., "Polarization Isolation Requirements for Linear Dual-Polarization Weather Radar in Simultaneous Transmission Mode of Operation," IEEE Transactions on Geoscience and Remote Sensing, vol. 44, No. 8, pp. 2019-2028, 2006.
D.N. McQuiddy Jr. et al., "Transmit/Receive Module Technology for X-Band Active Array Radar," Proceedings of the IEEE, vol. 79, No. 3, pp. 308-347, 1991.
J.L. Salazar, "T/R Modules for Active Phased. Array Radars," IEEE Radar Conference, 2015.
D. Gray, "How to Choose an Antenna Range Configuration," Proceed. Antenna Measurement Techniques Association, 2002.
J.A. Gordon et al., "Robotically Controlled Mm-Wave Near-Field Patter," Proc. Antenna Meas. Tech. Assoc., vol. 34, pp. 384-389, 2012.
L. Boehm et al., "An Automated Millimeter-Wave Antenna Measurement Setup Using a Robotic Arm," IEEE Antennas and Propagation Society, AP-S International Symposium (Digest), vol. Oct. 2015, pp. 2109-2110, 2015.
N. Petrovic et al., "Robot Controlled Data Acquisition System for Microwave Imaging," European Conf. Antennas Propagat. (EuCAP), pp. 3356-3360, 2009.
D. Novotny et al., "Antenna Measurement Implementations and Dynamic Positional Validation Using a Six Axis Robot," AMTA $37^{th}$ Annual Meeting and Symposium, 2015.
R. Medina et al., "Calibration and Validation of the CASA Phased Array Antenna." $9^{th}$ European Radar Conference (EuRAD), Oct. 29-Nov. 1, 2012, Amsterdam, Netherlands.
Jorge L. Salazar et al., "Development of an automated, low-cost near-field RF test station to characterize and calibrate 2-D electronically scanning active phased array antennas," 2014 IEEE International Symposium on Antennas and Propagation and USNC-URSI Radio Science, Jul. 6-11, 2014, Memphis, Tennessee, USA.

* cited by examiner

Thermal Image

RADIO FREQUENCY SCANNER

INCORPORATION BY REFERENCE

The present patent application claims priority to the provisional patent application identified by U.S. Ser. No. 62/393,947, filed on Sep. 13, 2016, the entire content of which is hereby incorporated herein by reference.

BACKGROUND

The telecommunication and radar industries are undergoing a dramatic evolution in solid state. Digital transmission technology currently demands much higher frequencies and RF complexity. This, in turn, demands advancements in how such frequencies are calibrated and tested. Conventional 4-axis chamber scanners are simply too big, too slow and lack the ability to make swift and customized measurements above 100 GHz and within the spherical coordinate system.

Active and electronically scanned phased array antennas are attractive options for atmospheric radar applications. Fast scanning performance, high reliability, and multifunction capabilities make this new technology an ideal candidate for next generation weather radars systems. One of the biggest challenges of using this technology, however, may be the strict requirements for dual-polarized measurements. Accurate differential reflectivity in weather radars requires high degree of beam pattern matching (below 0.1 dB), and high cross polarization isolation (below −40 dB) between H and V polarizations.

One common solution for automated antenna RF characterization is the use of a robotic manipulator with a RF probe attached to it to perform near-field (NF) measurements. Conventionally, these types of arrangements are classified in planar, cylindrical, and spherical systems according to the scan pattern they are able to execute. Moreover, these systems typically have no more than 4 degrees of freedom (DOF). Nonetheless, some of these systems need to be able to freely move the RF probe to any position and orientation in order to perform any arbitrary scan patterns. This requirement translates into the need for 6 DOF position capability. To add this versatility to the scanning setup, some researchers have included 6-axis industrial robotic arms to their NF measurement chambers. As an example, the National Institute of Standards and Technology (NIST) has developed a robotically controlled mm-wave NF scanner range, integrating a 6-axis robot, a high precision robotic hexapod, a commercial open-ended waveguide probe, and a laser tracker for measurement of antenna patterns. This system allows the possibility of performing different types of scan patterns for antenna measurements all using the same testing setup.

Additionally, for dual-polarized phased array radars (PAR) devised for atmospheric applications, large temperature gradients may induce significant phase errors. Such errors may affect the accuracy of the calibration process in the antenna array. In the case of low frequency and large phased array systems that operate in S- and C-bands, the maximum allowable temperature gradient across the array is generally on the order of 15° C. However, for a PAR that operates at higher frequency bands (for example, W-band), the maximum allowable temperature gradient across the array may be reduced to 1.2° C.

BRIEF DESCRIPTION OF THE DRAWINGS

Several embodiments of the present disclosure are hereby illustrated in the appended drawings. It is to be noted however, that the appended drawings only illustrate several typical embodiments and are therefore not intended to be considered limiting of the scope of the present disclosure. Further, in the appended drawings, like or identical reference numerals or letters may be used to identify common or similar elements and not all such elements may be so numbered. The figures are not necessarily to scale and certain features and certain views of the figures may be shown as exaggerated in scale or in schematic in the interest of clarity and conciseness.

DETAILED DESCRIPTION

Figure 1A:
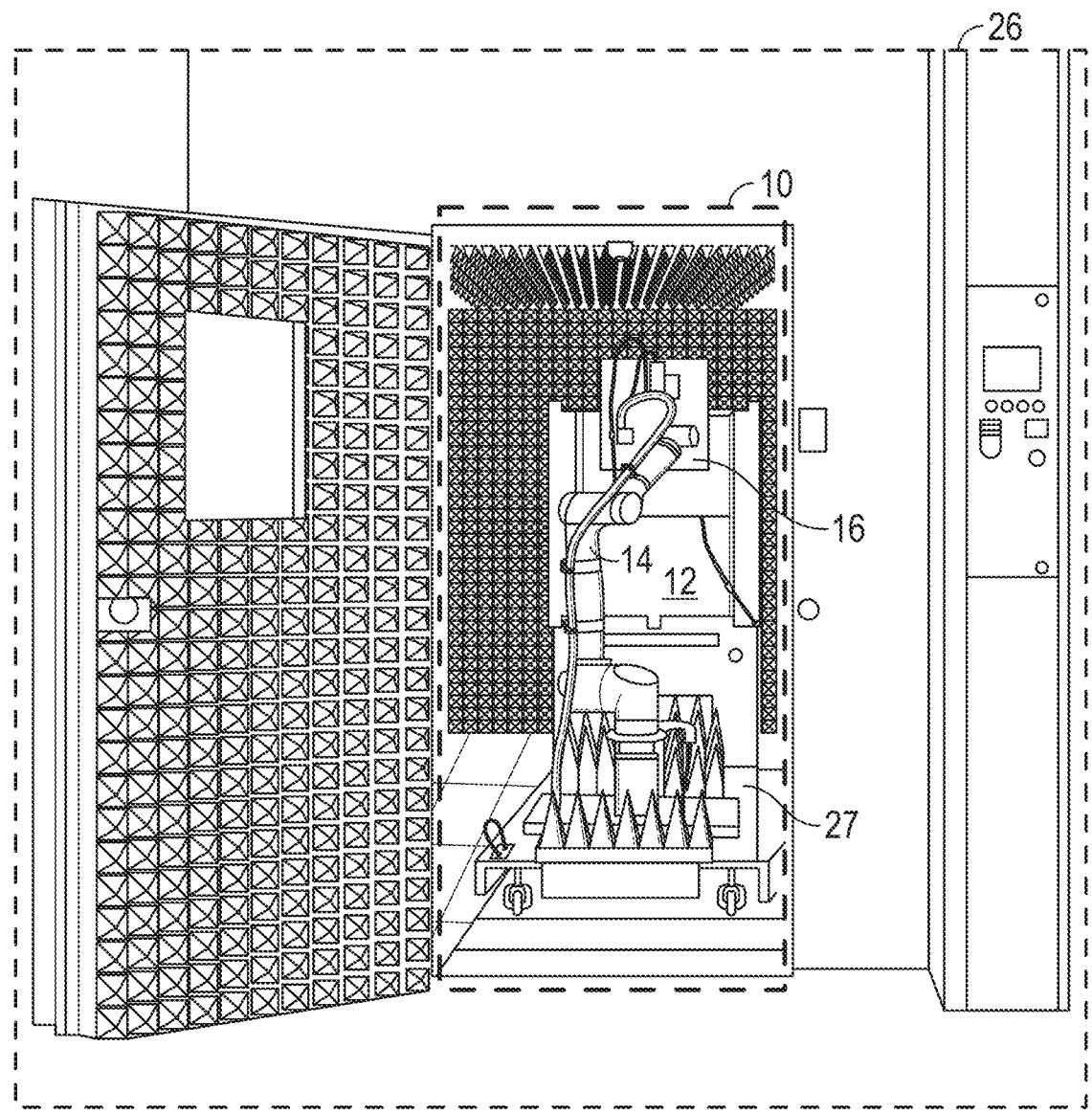
FIG. 1A is a perspective view an RF scanner system positioned inside of an enviromental chamber in accordance with the present disclosure.

Most active phased array antennas for weather radar applications may require high transmit power (from 10 kW to 100 kW) to attain the required radar sensitivity level. With sufficient radar sensitivity and polarization accuracy, it may be possible to distinguish different types of atmospheric signatures, depending on the range, especially for low-level precipitation which the radar requires a high sensitivity (−10 dBz to 10 dBz) to detect. In phased array antennas, the overall transmit power is distributed over several thousand active radiating elements, each one capable of managing 4 W to 10 W of peak power in typical systems.

Since generally underneath each active radiating element exists a high-power density T/R module, a significant amount of heat may be transferred into the radiating element from the T/R module. The generated heat can affect the performance of the PAR due to any temperature gradient in the array surface. Characterization of amplitude and phase of each radiating element in the array, as a function of temperature, may be needed to guarantee the effectiveness of any built-in calibration techniques, or to provide first-order look-up corrections vs. temperature, especially for weather applications wherein beam matching in antenna co-polar patterns may be less than 0.1 dB and cross-polarization isolation may be below −40 dB.

Further, panels on phased array antennas are generally not perfectly flat; nor is the electronic center of each radiating element consistently spaced by a known pitch. Moreover, as the operation temperature varies, thermal deformations of the active phased array antenna panel may change the location of panel radiating elements. Most active phased array antennas make use of multilayer structures composed of various dielectric materials. Phase stability over a temperature range with phase reference at room temperature (26° C.) may be needed to minimize the phase errors due to the thermal expansion.

The present disclosure, in at least certain embodiments, is directed to automated radio frequency (RF) scanner systems to characterize active phased array antennas and other RF devices that its performance is sensitive to temperature fluctuation. Generally, the RF scanner systems may enable characterization of electromagnetic surfaces, and thermal properties of active phased array antennas. For example, the RF scanner system may enable fully automated characterization of an active phased array antenna from 1 GHz to 60 GHz, and up to 100 GHz, over a temperature range of 0° C. to 50° C.

The RF scanner system may include an industrial multi-axis articulated robot used to move a sensor suite to perform near-field measurements, as well as, surface and thermal inspection of an active phased array antenna. For example, an arm of the multi-axis articulated robot may be configured to follow contours of active phased array antennas, thereby maintaining the sensor suite at a fixed distance away from an active phased array antenna as the active phased array antenna is being measured and characterized by the sensor suite.

The sensor suite may include one or more mechanical fixtures supporting an infrared camera, and an antenna array probe. The sensor suite may also include a surface sensor that may include a laser and an optical camera, each enabling characterization of topography and/or size of active phased array antennas. The sensor suite may also include a thermal imaging camera for obtaining information indicative of a plurality of thermal readings that collectively form a thermal distribution of the panel radiating elements.

The optical camera of the surface sensor may be used to capture one or more images and determine X and Y position of features of the active phased array antenna. The laser may be used to characterize deviations in the Z direction (e.g., "hills," i.e., peaks, and "valleys," i.e., depressions) of the surface of the active phased array antenna, or other material. In some embodiments, the surface can be characterized in different ways. For example, a pair of stereo cameras can be used for stereoscopically determining X, Y, and Z features of the active phased array antenna.

In some non-limiting embodiments, the active phased array antenna, robotic manipulator, and the sensor suite may be located inside of an environmental chamber. The interior of the environmental chamber and the exterior of the multi-axis articulated robot may be covered with RF microwave absorbers to prevent unwanted RF reflections. The interior of the environmental chamber may enable characterization of the active phased array antenna under controlled temperature and/or humidity.

Unless otherwise defined herein, scientific and technical terms used herein shall have the meanings that are commonly understood by those having ordinary skill in the art. Further, unless otherwise required by context, singular terms shall include pluralities and plural terms shall include the singular.

All patents, published patent applications, and non-patent publications mentioned in the specification are indicative of the level of skill of those skilled in the art to which the present disclosure pertains. All patents, published patent applications, and non-patent publications referenced in any portion of this application are herein expressly incorporated by reference in their entirety to the same extent as if each individual patent or publication was specifically and individually indicated to be incorporated by reference.

All of the systems and methods of production and application thereof disclosed herein can be made and executed without undue experimentation in light of the present disclosure. While the systems and methods of the present disclosure have been described in terms of particular embodiments, it will be apparent to those of skill in the art that variations may be applied to the systems and/or methods and in the steps or in the sequence of steps of the method described herein without departing from the concept, spirit and scope of the inventive concepts. All such similar substitutes and modifications apparent to those of skilled in the art are deemed to be within the spirit and scope of the inventive concepts disclosed herein.

It should be understood that the processes described in the present disclosure can be performed with the aid of a computer system running software adapted to perform the functions, and the resulting images and data are stored on one or more non-transitory computer readable mediums. Examples of a non-transitory computer readable medium include an optical storage device, a magnetic storage device, an electronic storage device or the like. The term "Computer System" as used herein means a system or systems that are able to embody and/or execute the logic of the processes described herein. The logic embodied in the form of software instructions or firmware may be executed on any appropriate hardware which may be a dedicated system or systems, or a specially programmed computer system, or distributed processing computer system. When the computer system is used to execute the logic of the processes described herein, such computer(s) and/or execution can be conducted at a same geographic location or multiple different geographic locations. Furthermore, the execution of the logic can be conducted continuously or at multiple discrete times. Further, such logic can be performed about simultaneously with the capture of the optical images, thermal images, RF information, or thereafter or combinations thereof.

As utilized in accordance with the methods and compositions of the present disclosure, the following terms, unless otherwise indicated, shall be understood to have the following meanings:

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or when the alternatives are mutually exclusive, although the disclosure supports a definition that refers to only alternatives and "and/or." The use of the term "at least one" will be understood to include one as well as any quantity more than one, including but not limited to, 2, 3, 4, 5, 6, 7, 8, 9, 10, 11, 12, 13, 14, 15, 16, 17, 18, 19, 20, 21, 22, 23, 24, 25, 30, 35, 40, 45, 50, 55, 60, 65, 70, 75, 80, 85, 90, 95, 100, or more, or any integer inclusive therein. The term "at least one" may extend up to 1000 or more, depending on the term to which it is attached; in addition, the quantities of 100/1000 are not to be considered limiting, as higher limits may also produce satisfactory results. In addition, the use of the term "at least one of X, Y and Z" will be understood to include X alone, Y alone, and Z alone, as well as any combination of X, Y and Z.

As used in this specification and claims, the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps. For example, unless otherwise noted, a process, method, article, or apparatus that comprises a list of elements is not necessarily limited to only those elements, but may also include elements not expressly listed or inherent to such process, method, article or apparatus.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AAB, BBC, AAABCCCC, CBBAAA, CABABB, and so forth. The skilled artisan will understand that typically there is no limit on the number of items or terms in any combination, unless otherwise apparent from the context.

Throughout this application, the term "about" may be used to indicate that a value includes an inherent variation of error, or the variation that exists among the study subjects. Further, in this detailed description and the appended claims, each numerical value (e.g., temperature or time) should be read once as modified by the term "about" (unless already expressly so modified), and then read again as not so modified unless otherwise indicated in context. For example but not by way of limitation, when the term "about" is utilized, the designated value may vary by plus or minus fifteen percent, plus or minus twelve percent, or plus or minus eleven percent, or plus or minus ten percent, or plus or minus nine percent, or plus or minus eight percent, or plus or minus seven percent, or plus or minus six percent, or plus or minus five percent, or plus or minus four percent, or plus or minus three percent, or plus or minus two percent, or plus or minus one percent, or plus or minus one-half percent.

Also, any range listed or described herein is intended to include, implicitly or explicitly, any number within the range, particularly all integers, including the end points, and is to be considered as having been so stated. For example, "a range from 1 to 10" is to be read as indicating each possible number, particularly integers, along the continuum between about 1 and about 10, including for example 2, 3, 4, 5, 6, 7, 8, and 9. Similarly, fractional amounts between any two consecutive integers are intended to be included herein, such as, but not limited to, 0.05, 0.1, 0.15, 0.2, 0.25, 0.3, 0.35, 0.4, 0.45, 0.5, 0.55, 0.6, 0.65, 0.7, 0.75, 0.8, 0.85, 0.9, and 0.95. For example, the range 3 to 4 includes, but is not limited to, 3.05, 3.1, 3.15, 3.2, 3.25, 3.3, 3.35, 3.4, 3.45, 3.5, 3.55, 3.6, 3.65, 3.7, 3.75, 3.8, 3.85, 3.9, and 3.95. Thus, even if specific data points within the range, or even no data points within the range, are explicitly identified or specifically referred to, it is to be understood that any data points within the range are to be considered to have been specified, and that the inventors possessed knowledge of the entire range and the points within the range.

As used herein, the term "substantially" means that the subsequently described event or circumstance completely occurs or that the subsequently described event or circumstance occurs to a great extent or degree. For example, the term "substantially" means that the subsequently described event or circumstance occurs at least 90% of the time, or at least 95% of the time, or at least 98% of the time, or comprises at least 90%, 95%, or 98% of the reference quantity.

Referring to the Figures, and in particular FIGS. 1A-1C and FIG. 2, shown therein is a RF scanner system 10 for characterization of electromagnetic surface(s), and thermal properties of an active phased array antenna 12. The RF scanner system 10 may include a multi-axis articulated robot 14 used to move a sensor suite 16 to perform near field (NF) measurements as well as surface and thermal measurements of the active phased array antenna 12. The sensor suite 16 may include a support fixture positioning a thermal camera 18, a laser 20, an optical camera 22 (e.g., high-definition camera), and an antenna array probe 24. Generally, the multi-axis articulated robot 14 is used to move the sensor suite 16 which contains the antenna array probe 24, the optical camera 22, the laser 20 for surface characterization, and the thermal camera 18 for temperature monitoring. The optical camera 22 may be used to capture one or more images and determine X, Y features of the active phased array antenna 12. The laser 20 may be used to characterize deviations in the Z direction (e.g., hills and valleys) on the surface of the active phased array antenna 12. In some non-limiting embodiments, a topographic sensor may be used in lieu of or in addition to the optical camera 22 and/or the laser 20. For example, two optical cameras 22 spaced a distance apart may be used to determine X, Y features and/or Z features of the surface of the active phased array antenna 12. Additionally, other stereo-photographic techniques may be used to determine X, Y features and/or Z features of the surface of the active phased array antenna 12. As such, RF, surface, and thermal properties of the active phased array antenna 12 may be determined. Even further, use of the multi-axis articulated robot 14 may allow for data regarding features of the active phased array antenna to be determined while the antenna array probe 24 continues in motion (e.g., at a constant speed or at an intermittent speed).

In at least certain embodiments, the RF scanner system 10 can be used to characterize the scattering and propagation properties of a radome that might affect signal transmission and reception of an antenna therein, for example using methods disclosed herein. Various parameters of the radome that can be characterized with the RF scanner system 10 include, but are not limited to, transmission efficiency, band-width change, beam imbalance, horizontal and/or vertical beam deflection, pattern distortion, signal attenuation, and antenna reflection characteristic.

In some non-limiting embodiments, the active phased array antenna 12, the multi-axis articulated robot 14, and the sensor suite 16 may be located inside of an environmental chamber 26. The environmental chamber 26 may enable characterization of the active phased array antenna 12 under at least one controlled parameter, such as temperature and/or humidity. In one non-limiting example, the combination of multi-axis articulated robot 14, sensor suite 16 environmental chamber 26 and a vector network analyzer (VNA), in addition to, a software interface 28, may provide automated characterization of the active phased array antenna 12 from 1 GHz to 18 GHz, up to 100 GHz, over a temperature range of 0 degrees Celsius to 50 degrees Celsius, for example.

Figure 1B:
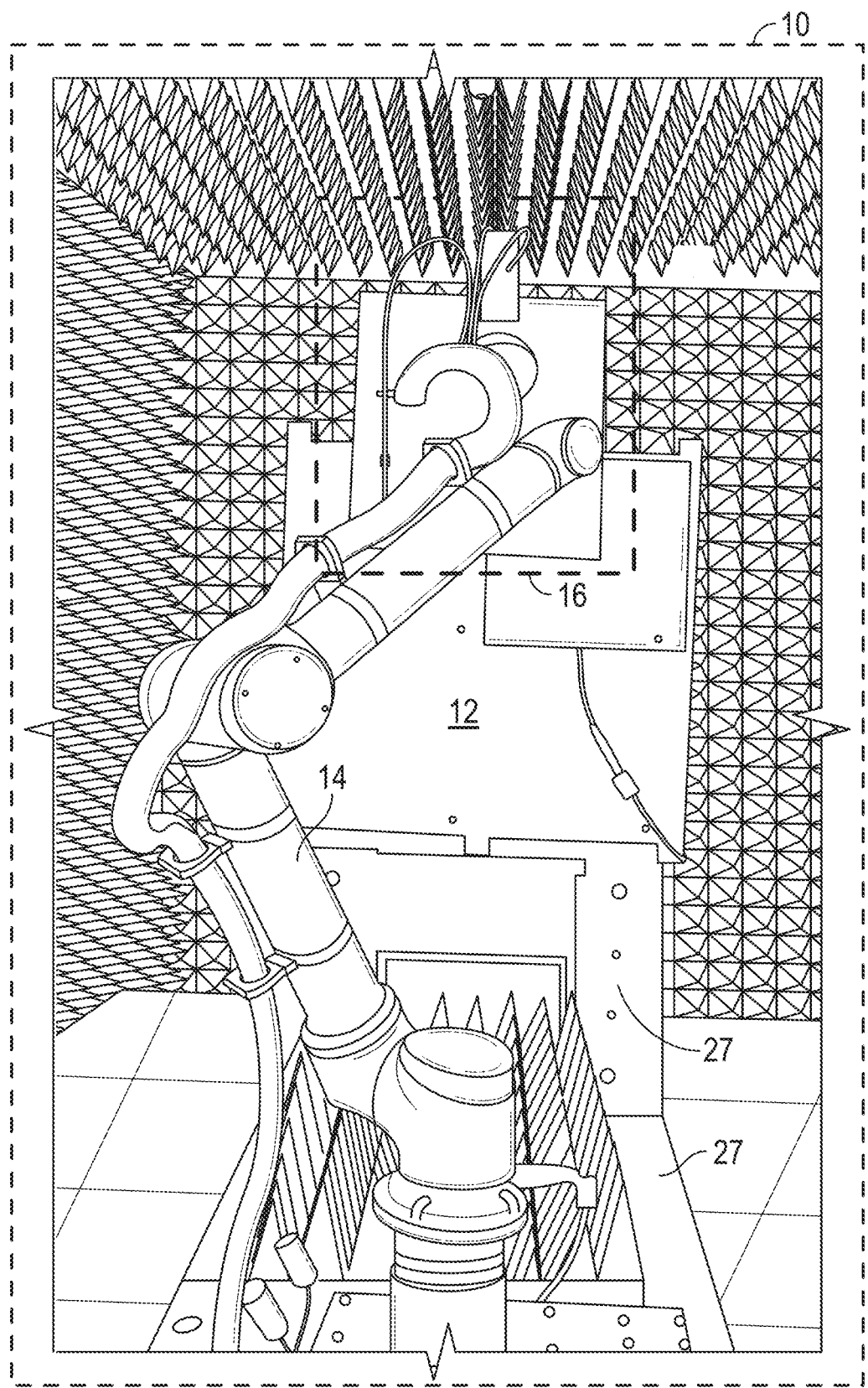
FIG. 1B is an enlarged view of the RF scanner system illustrated in FIG. 1A having a multi-axis articulated robot used to move a sensor suite to perform near field (NF) measurements as well as surface and thermal measurements of an active phased array antenna.

Referring to FIGS. 1A and 1B, the multi-axis articulated robot 14 and the active phased array antenna 12 may be mounted facing each other on a mechanical fixture 27. In at least certain embodiments, the multi-axis articulated robot 14 may be mounted on a separate stage. Generally, the multi-axis articulated robot 14 may allow for scanning of the active phased array antenna 12 by the sensor suite 16 in any pattern. In some non-limiting embodiments, mounting of the multi-axis articulated robot 14 on the mechanical fixture 27 and/or the separate stage may provide six degrees of freedom in orientation and alignment. Additionally, mounting of the active phased array antenna 12 on a separate stage and/or the mechanical fixture 27 may provide six degrees of freedom in orientation and alignment for a total of twelve degrees of freedom between the multi-axis articulated robot 14 and the active phased array antenna 12.

In some embodiments, the laser 20 may provide for a laser beam reflecting off of targets, such as an antenna surface, on the end of the multi-axis articulated robot 14 and may track the position of the antenna array probe 24. The active phased array antenna 12 may be kept motionless on the mechanical fixture 27 and/or the separate stage while the antenna array probe 24 sweeps through an arc (e.g., arc of up to 240 degrees) around the active phased array antenna 12. The active phased array antenna 12 may then be rotated a small increment, and another sweep may be made. The process may be repeated until data collected and determined provides a spherical picture of performance of the active phased array antenna 12. During collection and determination of the data, the antenna array probe 24 may be continuously moving (e.g., at a constant speed). In at least some embodiments, the antenna array probe 24 may be intermittently moving.

In some non-limiting embodiments, the multi-axis articulated robot 14 may be a 6-axis articulated robot; however, the multi-axis articulated robot 14 may include any number of axes greater than six. In some embodiments, the multi-axis articulated robot 14 moves to follow contour of the active phased array antenna 12, thereby maintaining the sensor suite 16 a fixed distance from the active phased array antennas 12 as the active phased array antennas 12 are being measured and characterized by the sensor suite 16.

Figure 1C:
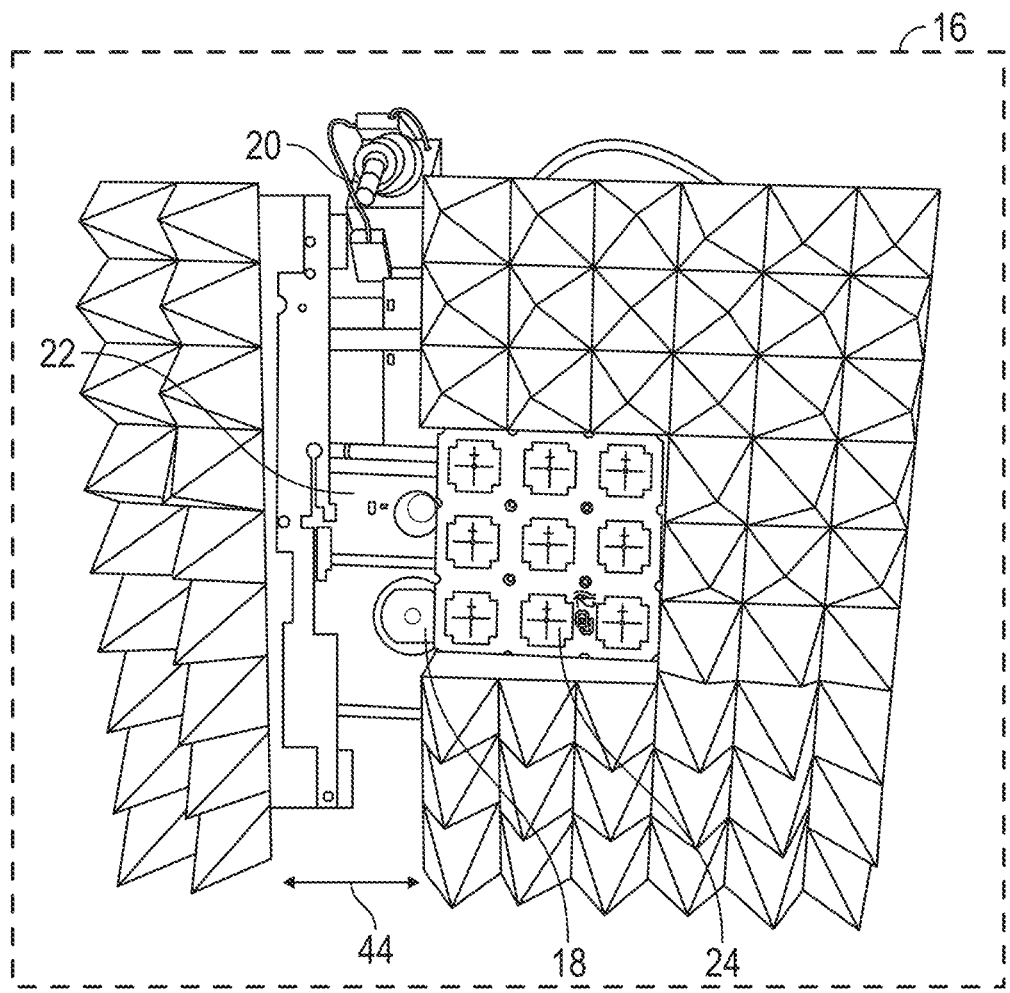
FIG. 1C is an enlarged view of the sensor suite illustrated in FIG. 1B.
Figure 2:
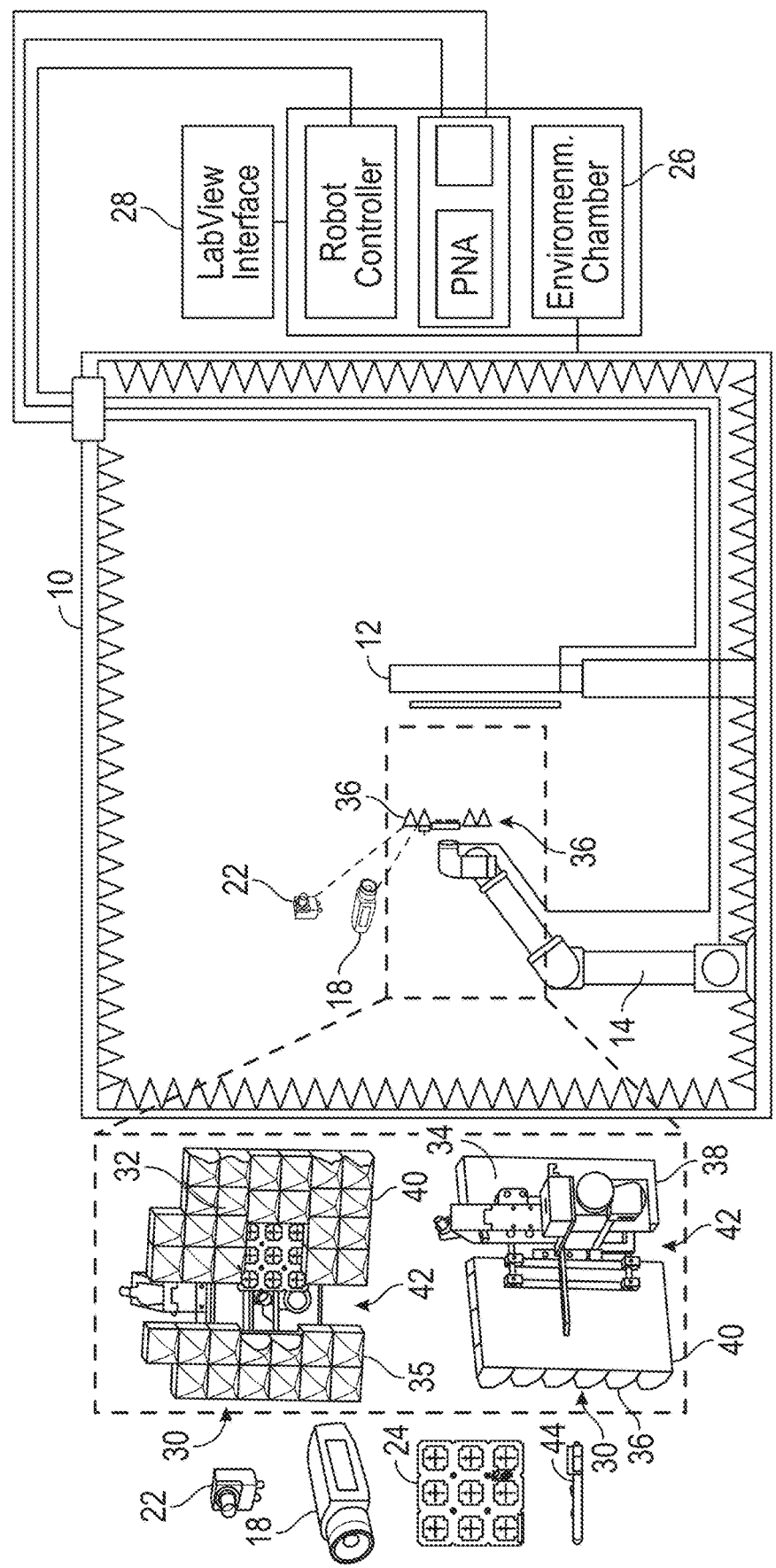
FIG. 2 is a block diagram of the RF scanner system illustrated in FIG. 1 including a perspective view of a front end and a back end of an exemplary sensor suite illustrating locations of sensors and actuators.

Referring to FIGS. 1C and 2, in some embodiments, the sensor suite 16 is attached or mounted on one end of the multi-axis articulated robot 14. In some non-limiting embodiments, the sensor suite 16 may include a shield 30 having a front surface 32 facing the active phased array antenna 12 and a back surface 34 opposite of the front surface 32. The front surface 32 may be covered with RF microwave absorbers 36 and the back surface 34 may be devoid of RF microwave absorbers 36. The optical camera 22, the thermal camera 18 and the laser 20 may be positioned adjacent to and mounted on the rear surface of the shield 30. The shield 30 may be provided as a mechanical shutter having at least two separate portions that are movable relative to each other so as to selectively expose and cover the optical camera 22, the thermal camera 18 and the laser 20. For example, the at least two separate portions may be implemented as a first portion 38 and a second portion 40 that are movable away from each other to define an aperture 42 aligned with the optical camera 22, the thermal camera 18 and the laser 20. The shield 30 may also be provided with one or more actuators 44 for selectively moving the first portion 38 relative to the second portion 40. The first portion 38 and the second portions 40 may include a substrate covered with RF microwave absorbers 36 on the front surfaces thereof.

Figure 3B:
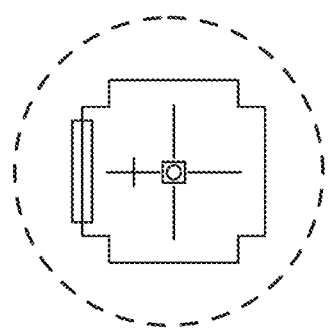
FIG. 3B is an image illustrating pattern recognition performed on a fiducial mark of an array element of the active phased array antenna.
Figure 3A:
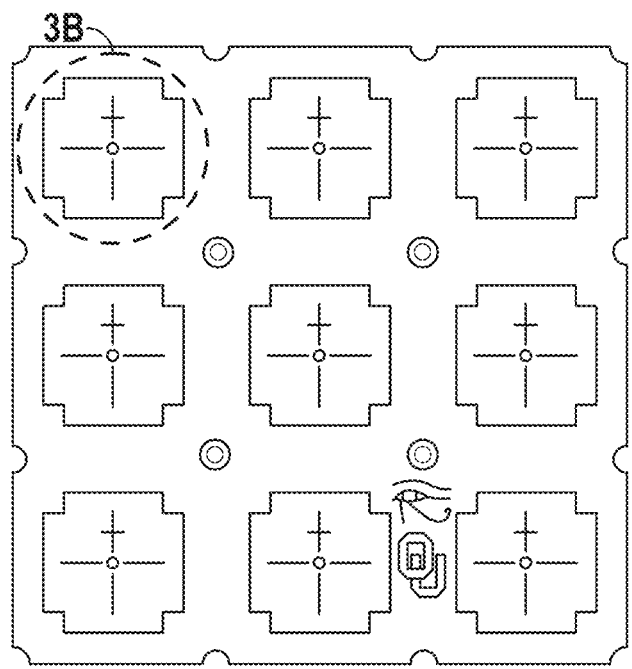
FIG. 3A is an image of a 3×3 arrangement on an exemplary active phased array antenna having fiducial marks indicating central points of each radiating element within the array.

The optical camera 22 and the laser 20 are capable of characterizing topography and size of the active phased array antenna 12. The optical camera 22 may be used in conjunction with the laser 20 to inspect the surface of the active phased array antenna 12 when the shutter mechanism is open defining the aperture 42. The setup may be able to measure the position of each radiating element of the active phased array antenna 12, relative to the others, using machine vision techniques. In some embodiments, a printed fiducial mark located exactly at the center of each radiating element is used to facilitate the recognition of each element and its position by the machine vision system, as shown in FIG. 3A. The optical camera 22 may be capable of pattern recognition from the scanned images of the fiducial marks, shown in FIG. 3B. As such, location of the X, Y position of the center of the radiating element may be determined and also quantification of the rotation angle of the plane of the element, both with respect to the current position of the sensor suite 16. In some non-limiting embodiments, location measurement resolution of 24 m can be attained.

The laser 20 may be mounted on the top of the sensor suite 16 and configured to indirectly measure the Z coordinate of the element, i.e., the distance between the sensor suite 16 and the element on the surface of the active phased array antenna 12. The laser 20 draws a reference line on the surface of the active phased array antenna 12, which by techniques of optical triangulation executed by the machine vision camera, can be used to determine how far the surface of the active phased array antenna 12 may be from the sensor suite 16. In effect, using machine vision may allow for measurement of the X, Y and Z coordinates of the center point of the radiating element, and the misalignment angle between the antenna array probe 24 and element on the active phased array antenna 12.

In some non-limiting embodiments, several images of the surface of the active phased array antenna 12 antenna may be stitched together to generate a mosaic of the entire panel. This mosaic may allow for characterization of distances between radiating elements, according to the temperature gradient on the surface of the active phased array antenna 12. Additionally, gaps intentionally placed between subarrays for operational systems may be determined using characterization of distances between radiating elements according to the temperature gradient on the surface of the active phased array antenna 12.

Figure 3C:
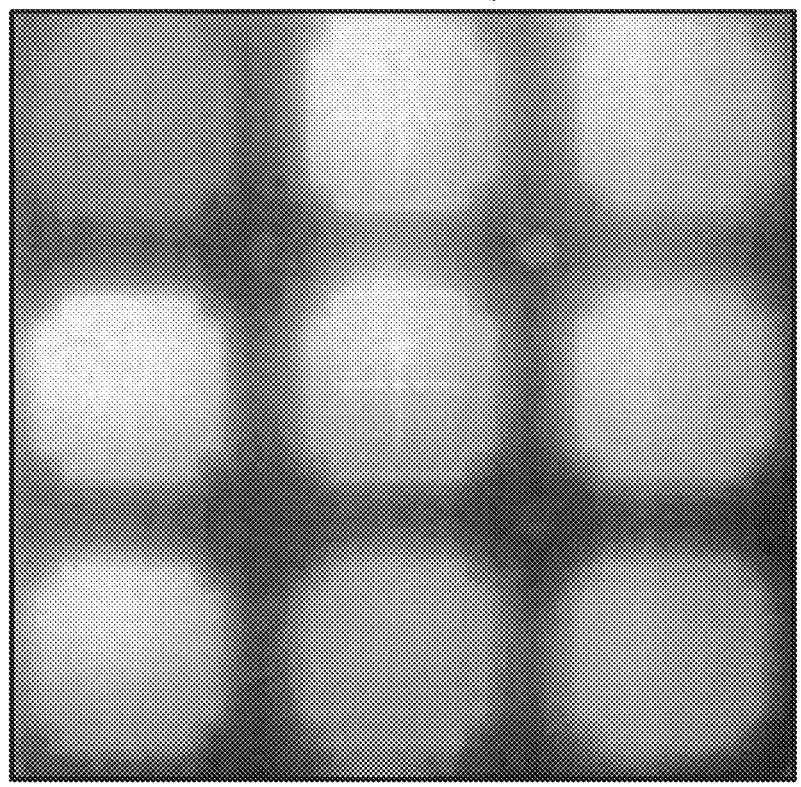
FIG. 3C is an image of a 3×3 antenna array probe taken by a thermal camera. Different colors identify temperature gradients on the surface of the active phased array antenna.

The thermal camera 18 may be any thermal imaging camera used to detect the thermal state of radiating elements. In a non-limiting example, the thermal camera 18 may be a thermal camera manufactured by FLIR Systems, having a principal place of business in Wilsonville, Oreg. The thermal camera 18 may be used to detect the thermal state of the radiating elements of the active phased array antenna 12. The thermal camera 18 may use infrared technology, for example, to capture the heat radiation of one or more radiating elements, producing a thermal profile. The thermal image can be processed by computer software to obtain correct temperature values for characterization of the active phased array antenna 12. Consequently, the function of the thermal camera 18 is to provide the information needed to characterize the thermal gradients along the surface of the active phased array antenna 12. FIG. 3C shows an image of a 3-by-3 sub-array of the active phased array antenna 12 taken by the thermal camera 18 wherein different colors represent different temperatures.

Figure 3D:
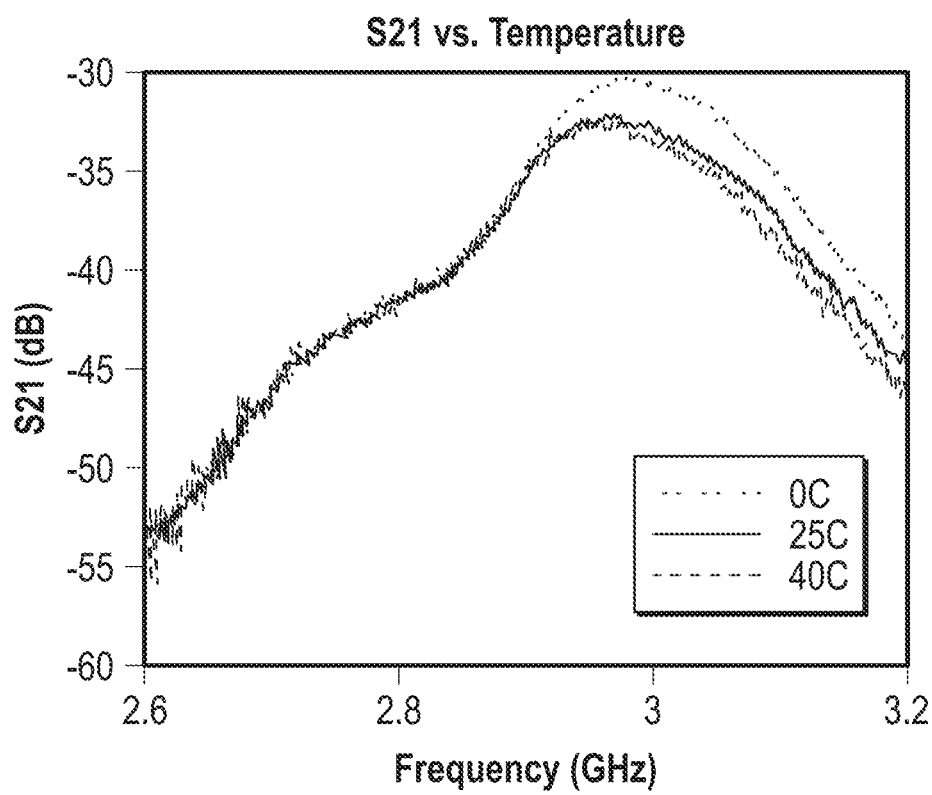
FIG. 3D is a graphical representation of near-field measurements taken by an antenna array probe illustrating behavior of S-Parameters in amplitude and phase at different test temperatures.
Figure 3D:
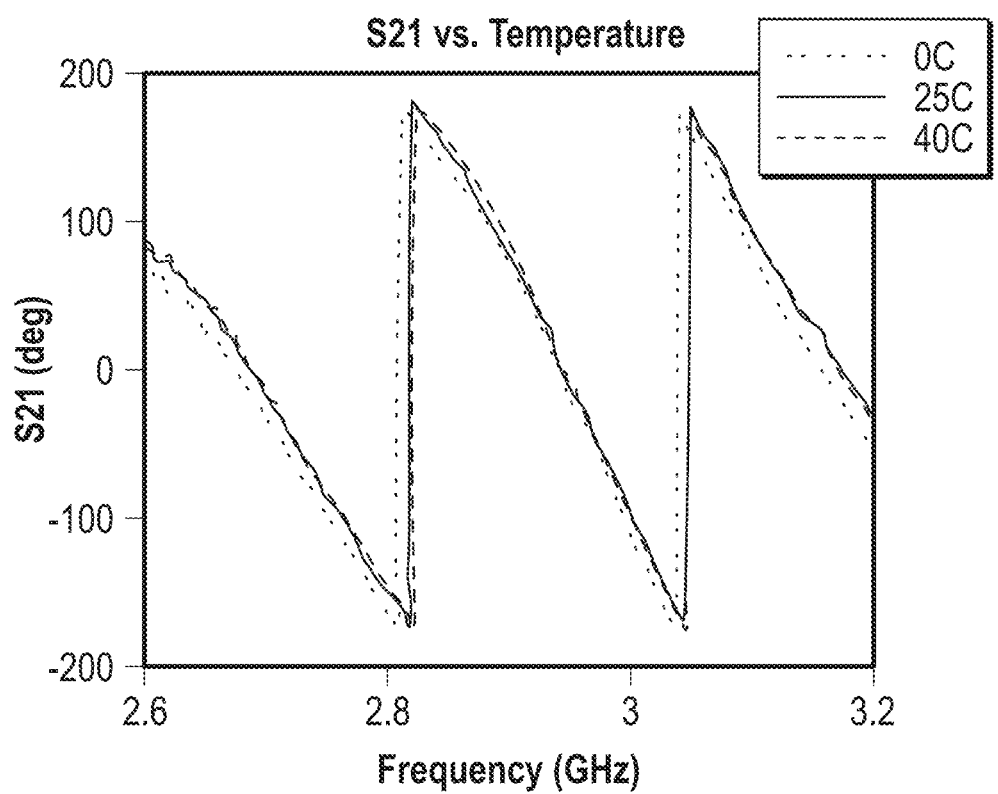

In some non-limiting embodiments, the antenna array probe 24 may be implemented as a dual polarized cross-stacked antenna array. Exemplary embodiments of dual polarized cross-stacked antenna arrays are set forth in U.S Patent Application Publication No. 2016/0079672, (the entire disclosure of which is hereby incorporated herein by reference) and the article titled, and published on. In one non-limiting embodiment, the antenna array probe 24 may include an n×m array of antenna elements. For example, the antenna array probe 24 may be a 3-by-3 antenna array although other sizes of arrays can be used. The design of the antenna array probe 24 may be optimized to minimize the potential impact on the NF measurements accuracy that can be affected by the coupling between the antenna array probe 24 and active phased array antenna 12. The design may also take into consideration the reduction of the payload of the multi-axis articulated robot 14, for position accuracy. The antenna array probe 24 may be connected to a 2-port vector network analyzer (VNA). The other port of the VNA may be connected to the active phased array antenna 12. The antenna array probe and the VNA may allow the RF scanner system 10 to take S-Parameters measurements as shown in FIG. 3D.

Referring to FIGS. 1A-1C and FIG. 2, in some non-limiting embodiments, the environmental chamber 26 may be used to control and monitor the test environment temperature and/or humidity during the characterization of the active phased array antenna 12. The environmental chamber 26 can be described as a closed room that may be thermally isolated, with an air conditioning system for controlling and tracking the temperature and/or humidity inside the environmental chamber 26. The environmental chamber 26 implemented may allow, for example, a range of temperature testing of −30° C. to 85° C. With the active phased array antenna 12 and sensor suite 16 located on the inside of the environmental chamber 26, as indicated in FIG. 1, performance of active phased array antenna 12 may be determined at different temperature conditions. In some non-limiting embodiments, the interior of the environmental chamber 26 may be covered with RF microwave absorbers 36 to prevent unwanted RF reflections.

The RF scanner system 10 may be configured to perform three stages of the process of characterization: surface characterization of the active phased array antenna 12, RF characterization of each radiating element in the active phased array antenna 12, and temperature characterization of the active phased array antenna 12. All the stages can be performed as discrete steps at different instances of time that are to be performed under conditions of controlled temperatures. Additionally, processes may be commanded by a software program stored on one or more non-transitory computer readable medium that includes instructions for implementing a visual user interface. As such, the user may be able to select the radiating elements to be characterized and set the ranges of frequency and temperature operation while monitoring in real time the measured values. Additionally, the software may be configured to set one or more environmental parameter, such as temperature, inside the environmental chamber 26 in order to evaluate the performance of the active phased array antenna 12 as a function of the environmental parameter. In some non-limiting embodiments, the software may interface with the controller of the active phased array antenna 12 to evaluate performance of the internal calibration procedure of the active phased array antenna 12, using the RF scanner system 10 as the "ground truth" estimator of amplitude and phase errors.

In some embodiments, the first stage of operation is the surface characterization of the active phased array antenna 12. During the first stage, the scanner opens the shutter mechanism to expose the radiating elements of the active phased array antenna 12 to the optical camera 22 and the laser 20, and then registers the position of each radiating element of the active phased array antenna 12 using the optical camera 22 and laser 20, which may also be used to register the absolute position of each radiating element across the active phased array antenna 12 using machine vision.

During this stage, the multi-axis articulated robot 14 may be used to move the sensor suite 16 to obtain information about the radiating elements of the active phased array antenna 12. First, the multi-axis articulated robot 14 may position the sensor suite 16 parallel to the active phased array antenna 12, at a location wherein the range of vision of the optical camera 22 can capture the fiducial mark of an element on the active phased array antenna 12. The scanner proceeds to open the shutter to enable the operation of the optical camera 22 and the laser 20. The optical camera 22 may take an image, and later process the image to calculate the position (X, Y and Z coordinates) of a fiducial mark using machine vision, as well as the misalignment angle between the antenna array probe 24 and the active phased array antenna 12. From this analysis it may be possible to measure distances among adjacent radiating elements once the (X, Y and Z coordiantes are known), and the angle of the sensor suite 16 with the active phased array antenna 12. By iterating this procedure, the positions and misalignment angles of all or a preselected group of the radiating elements of the active phased array antenna 12 can be measured relative to each other. Furthermore, since the environmental chamber 26 may be controlled by a user interface, the surface characterization stage may allow the RF scanner system 10 to characterize the thermal expansion of the active phased array antenna 12 as a function of temperature.

In some embodiments, the second stage of operation is thermal characterization to register the temperature gradients of the surface of the active phased array antenna 12. The thermal camera 18 and the multi-axis articulated robot 14 may be used simultaneously. First, using the location data of the radiating elements of the active phased array antenna 12 obtained from the surface characterization stage, and while having the shutter open, the multi-axis articulated robot 14 may position the thermal camera 18 in front of at least one of the radiating elements of the active phased array antenna 12. Next, the thermal camera 18 may capture an image of the thermal profile of the area surrounding the at least one radiating element of the active phased array antenna 12. By processing the image, the temperature gradients along the surface of the active phased array antenna 12 can be characterized. Even further, adverse effects of the temperature gradients over the surface dimensions and RF performance of the active phased array antenna 12 may be determined.

In some embodiments, the last stage is the RF characterization, which measures the radiation performance of the PAR. At this stage, the scanner will close the shutter, placing the antenna array probe 24 in front of the center of the radiating element of the active phased array antenna 12. Next, the RF scanner system 10 may trigger the VNA to measure the S-parameters at the current configuration of the environmental parameter, such as temperature.

In at least certain embodiments, the present disclosure is directed to a system, comprising: a radio frequency (RF) scanner system comprising: a multi-axis articulated robot having a first end and a second end; and, a sensor suite positioned on the first end of the multi-axis articulated robot. The sensor suite comprising a shield having a first side and a second side opposite the first side, the first side configured for positioning towards an active phased array antenna, an antenna array probe, and a surface sensor configured to determine X, Y, and Z positions of the active phased array antenna.

In other embodiments, the present disclosure is directed to a method for characterizing a surface of an active phased array antenna having a plurality of radiating elements, comprising: capturing, by a surface sensor, at least one image of an active phased array antenna, the surface sensor positioned in a sensor suite mounted on a multi-axis articulated robot; and determining X, Y and Z features of the active phased array antenna using the at least one image.

In yet other embodiments, the present disclosure is directed to a method for characterizing an active phased array antenna having a plurality of radiating elements, comprising: capturing at least one thermal image of an active phased array antenna by a thermal imaging camera mounted on a multi-axis articulated robot.

In yet other embodiments, the present disclosure is directed to a radio frequency scanner system, comprising: a multi-axis robot; an antenna array probe supported by the multi-axis robot; and a control system configured to send control signals to the multi-axis robot to move the antenna array probe in a predetermined manner, to collect sensor data from the antenna array probe indicative of near-field radio frequency measurements, and to correlate the sensor data with particular locations of the antenna array probe.

[1] D. S. Zrnic, J. F. Kimpel, D. E. Forsyth, A. Shapiro, G. Crain, R. Ferek, J. Heimmer, W. Benner, T. J. McNellis, and R. J. Vogt, "Agile-beam phased array radar for weather observations," Bulletin of the American Meteorological Society, vol. 88, no. 11, pp. 1753-1766, 2007.

[2] Y. Wang and V. Chandrasekar, "Polarization isolation requirements for linear dual-polarization weather radar in simultaneous transmission mode of operation," IEEE Transactions on Geoscience and Remote Sensing, vol. 44, no. 8, pp. 2019-2028, 2006.

[3] D. N. McQuiddy Jr, R. L. Gassner, P. Hull, J. S. Mason, and J. M. Bedinger, "Transmit/receive module technology for X-band active array radar," Proceedings of the IEEE, vol. 79, no. 3, pp. 308-341, 1991.

[4] J. L. Salazar, "T/R Modules for Active Phased Array Radars," IEEE Radar Conference, 2015.

[5] D. Gray, "How to choose an antenna range configuration," Proceed. Antenna Measurement Techniques Association, 2002.

[6] J. A. Gordon, D. R. Novotny, J. B. Coder, J. R. Guerrieri, and B. Stillwell, "Robotically Controlled Mm-Wave Near-Field Pattern," Proc. Antenna Meas. Tech. Assoc., vol. 34, pp. 384-389, 2012.

[7] L. Boehm, F. Boegelsack, M. Hitzler, and C. Waldschmidt, "An auto-mated millimeter-wave antenna measurement setup using a robotic arm," IEEE Antennas and Propagation Society, AP-S International Symposium (Digest), vol. 2015-Octob, pp. 2109-2110, 2015.

[8] N. Petrovic, T. Henriksson, N. Joachimowicz, and M. Otterskog, "Robot controlled data acquisition system for microwave imaging," European Conf. Antennas Propagat. (EuCAP), pp. 3356-3360, 2009.

[9] D. Novotny, J. Gordon, A. Curtin, R. Wittmann, M. Francis, and J. Guer-rieri, "Antenna Measurement Implementations and Dynamic Positional Validation Using a Six Axis Robot," AMTA 37th Annual Meeting and Symposium, 2015.

[10] R. Medina, J. Salazar, E. Knapp, and D. J. McLaughlin, "Calibration and validation of the CASA phased array antenna." 9th European Radar Conference (EuRAD), Oct. 29-Nov. 1, 2012, Amsterdam, Netherlands.

[11] Jorge. L. Salazar, Alessio Mancini, James Ranson and Eric Loew, "Development of an automated, low-cost near-field RF test station to characterize and calibrate 2-D electronically scanning active phased array antennas". 2014 IEEE International Symposium on Antennas and Propagation and USNC-URSI Radio Science July 6-11, 2014, Memphis, Tenn., USA.

What is claimed is:

1. A system, comprising:
a radio frequency (RF) scanner system comprising:
    a multi-axis articulated robot having a first end and a second end; and,
    a sensor suite attached to the first end of the multi-axis articulated robot, the sensor suite comprising:
        one or more mechanical fixture attached to the first end of the multi-axis articulated robot
        a shield supported by the one or more mechanical fixture, the shield having a front surface and a back surface opposite the front surface, the front surface configured for positioning towards an active phased array antenna, the front surface having at least one microwave absorber,
        an antenna array probe supported by the one or more mechanical fixture on the front surface of the shield, the shield extending beyond the antenna array probe,
        a surface sensor supported by the one or more mechanical fixture on the back surface of the shield, the surface sensor having a field of view, the surface sensor configured to characterize an electromagnetic surface of the active phased array antenna; and wherein the shield has a surface area sufficient to cover the field of view of the surface sensor, and is configured to be movable between a first position so as to not block the field of view of the surface sensor, and a second position to block the field of view of the surface sensor.

2. The system of claim 1, wherein the back surface of the shield is devoid of RF microwave absorbers.

3. The system of claim 1, wherein the surface sensor is adjacent to and mounted on the back surface of the shield.

4. The system of claim 1, wherein the surface sensor comprises an optical camera and a laser.

5. The system of claim 1, wherein the shield includes a first portion and a second portion, the second portion moveable relative to the first portion so as to form a gap aligned with a portion of the active phased array antenna and to selectively expose and cover the surface sensor.

6. The system of claim 5, wherein the shield further comprises at least one actuator for selectively moving the first portion relative to the second portion.

7. The system of claim 5, wherein the first portion includes at least one RF microwave absorber.

8. The system of claim 1, wherein the sensor suite further comprises a thermal camera.

9. A radio frequency scanner system, comprising:
a multi-axis articulated robot having a first end and a second end;
one or more mechanical fixture attached to the first end of the multi-axis articulated robot;
an antenna array probe supported by the one or more mechanical fixture attached to the multi-axis articulated robot and having a first field of view;
a surface sensor supported by the one or more mechanical fixture attached to the multi-axis articulated robot and having a second field of view coincident with the first field of view; and
a control system having one or more processors, the one or more processors executing computer executable instructions to cause the one or more processors to:

send control signals to the multi-axis articulated robot to move the antenna array probe in a predetermined manner;

to collect sensor data from the antenna array probe indicative of near-field radio frequency measurements;

to correlate the sensor data with particular locations of the antenna array probe; and to characterize an electromagnetic surface of an active phased array antenna scanned by the antenna array probe with data obtained from the surface sensor.

10. The system of claim 8, wherein the thermal camera is a thermal imaging camera.

11. The system of claim 1, wherein the sensor suite includes a thermal camera configured to determine one or more thermal properties of the active phased array antenna.

12. The system of claim 1, wherein the sensor suite is further configured to determine fully automated characterization of the active phased array antenna within a range from 1 GHz to 59 GHz.

13. The system of claim 1, wherein the sensor suite is further configured to determine fully automated characterization of the active phased array antenna from 0° C. to 50°C.

14. The system of claim 1, wherein the surface sensor comprises a topographic sensor.

15. The system of claim 4, wherein the optical camera and the laser are further configured to characterize the topography of the active phased array antenna.

16. The system of claim 4, wherein the optical camera and the laser are further configured to determine the topography and size of the active phased array antenna.

17. The system of claim 8, wherein the thermal camera is configured to determine a thermal state or distribution of one or more radiating elements of the active phased array antenna.

18. The system of claim 1, further comprising an environmental chamber configured to control and monitor temperature and or humidity.

19. The radio frequency scanner system of claim 9, comprising an optical camera and laser supported by the multi-axis articulated robot and configured to determine the topography and size of the active phased array antenna.

20. The radio frequency scanner system of claim 9, comprising a thermal camera supported by the multi-axis articulated robot and configured to determine a thermal state or distribution of one or more radiating elements of the active phased array antenna.

* * * * *